United States Patent [19]
Omata

[11] Patent Number: 5,091,744
[45] Date of Patent: Feb. 25, 1992

[54] ILLUMINATION OPTICAL SYSTEM
[75] Inventor: Takashi Omata, Yokosuga, Japan
[73] Assignee: Canon Kabushiki Kaisha, Tokyo, Japan
[21] Appl. No.: 715,743
[22] Filed: Jun. 18, 1991

Related U.S. Application Data

[63] Continuation of Ser. No. 630,733, Dec. 20, 1990, abandoned, which is a continuation of Ser. No. 522,456, May 14, 1990, abandoned, which is a continuation of Ser. No. 423,580, Oct. 17, 1989, abandoned, which is a continuation of Ser. No. 355,854, May 17, 1989, abandoned, which is a continuation of Ser. No. 127,612, Nov. 30, 1987, abandoned, which is a continuation of Ser. No. 699,800, Feb. 8, 1985, abandoned.

[30] Foreign Application Priority Data

Feb. 13, 1984 [JP] Japan ................. 59-2289
Jan. 8, 1985 [JP] Japan ................. 60-12941
Jan. 31, 1985 [JP] Japan ................. 60-17052

[51] Int. Cl.$^5$ ............................. G03B 27/42
[52] U.S. Cl. ...................... 355/53; 355/46; 355/67; 355/68; 355/70; 355/77
[58] Field of Search ............ 355/46, 53, 64, 67, 355/68, 70, 77

[56] References Cited

U.S. PATENT DOCUMENTS

| | | | |
|---|---|---|---|
| 1,789,112 | 1/1931 | Owens | 355/46 |
| 1,836,038 | 12/1931 | Owens | 355/46 |
| 2,515,862 | 7/1950 | Carlton et al. | 355/46 |
| 3,494,695 | 2/1970 | Sollima et al. | 355/53 |
| 3,566,763 | 3/1971 | Knopf | 355/53 |
| 4,095,891 | 6/1978 | Lovering | 355/64 |
| 4,132,479 | 1/1979 | Dubroeucq et al. | |
| 4,373,774 | 2/1983 | Dubroeucq et al. | |
| 4,493,555 | 1/1985 | Reynolds | |
| 4,703,166 | 10/1987 | Bruning | 250/201 |
| 4,773,750 | 9/1988 | Bruning | 353/122 |
| 4,785,192 | 11/1988 | Bruning | 250/548 |

FOREIGN PATENT DOCUMENTS

| | | | |
|---|---|---|---|
| 066053 | 12/1982 | European Pat. Off. | 355/53 |
| 777923 | 3/1935 | France | 355/46 |
| 1000670 | 2/1952 | France | 355/46 |
| 2519156 | 7/1983 | France | |
| 1-23444 | 9/1975 | Japan | |
| 54-111832 | 9/1979 | Japan | |
| 2-15621 | 12/1983 | Japan | |
| 2-22522 | 12/1983 | Japan | |

OTHER PUBLICATIONS

Article "Square Blue Laser" *Popular Science* May, 1983.

Primary Examiner—Monroe H. Hayes
Attorney, Agent, or Firm—Fitzpatrick, Cella, Harper & Scinto

[57] ABSTRACT

An illumination optical system including a plurality of separate laser sources or a plurality of separate secondary light sources defined by the laser beams emerging from the laser sources. On an area to be illuminated, the laser beams emerging from the laser sources or emerging from the secondary light sources are superposed upon one another, whereby uniform exposure and an improved imaging performance are assured.

14 Claims, 3 Drawing Sheets

ILLUMINATION OPTICAL SYSTEM

This application is a continuation of prior application, Ser. No. 07/630,733 filed Dec. 20, 1990, which application is a continuation of prior application, Ser. No. 07/522,456 filed May 14, 1990, which application is a continuation of prior application, Ser. No. 07/423,580 filed Oct. 17, 1989, which application is a continuation of prior application, Ser. No. 07/355,854 filed May 17, 1989, which application is a continuation of prior application, Ser. No. 07/127,612 filed Nov. 30, 1987, which application is a continuation of prior application, Ser. No. 06/699,800 filed Feb. 8, 1985, all now abandoned.

BACKGROUND OF THE INVENTION

This invention relates to an illumination optical system and, more particularly, to an illumination optical system having a laser as a light source thereof and suitable to be applied to an exposure apparatus for the manufacture of integrated circuit devices.

Recent trends of further miniaturization of a pattern on an integrated circuit has forced development of optical lithography using a light beam in the deep UV region, i.e. having a wavelength in the range of 200–330 nm. In such optical lithography, a super Hg lamp or an Xe-Hg lamp is often used as the light source. Since, however, the Hg lamp or Xe-Hg lamp has substantially no directionality and provides poor luminance, use of such a lamp as the light source results in a prolonged exposure time and, thus, in a decreased throughput.

Development of lasers providing laser beams in shorter wavelength regions has been advanced, so that it is now possible to introduce a laser of high luminance in the deep UV region, as described, into an exposure apparatus for the manufacture of semiconductor circuit devices.

In the field of exposure apparatuses, it is known to use an optical system to form a plurality of secondary light sources in order to prevent image distortion on the wafer surface owing to the diffraction effect caused by the pattern of the mask.

More specifically, in a high resolution imaging optical system such as employed in the exposure apparatus, the ratio between the numerical aperture of the illumination optical system and the numerical aperture of the projection optical system has a significant affect on the imaging performance. If the numerical aperture of the illumination optical system is small as compared with that of the projection optical system, there occurs a higher degree of distortion in the pattern projected, though the contrast is improved. For this reason, the ratio is usually set in the range of approx. 0.3–0.8. In order to achieve such a ratio, the light emitting portion of the light source in the illumination system must have some degree of expansion. In view of this, a plurality of point light sources are formed with minute gaps maintained therebetween to define a light source having an apparent expansion. The light beams emitted from such an apparently expanded light source are superposed, by means of optics, upon one another on the surface to be irradiated.

Such a technique of forming plural secondary light sources would not be directly applied to an exposure apparatus employing a laser as the light source means. This is because, if the laser beam emitted from a single laser source is divided to define a plurality of secondary light sources, the split laser beams emerging from the secondary light sources would interfere with each other due to high coherence of the laser beam so that interference fringes would appear on the mask surface, resulting in enormously uneven exposure.

SUMMARY OF THE INVENTION

It is accordingly a primary object of the present invention to provide a high-power illumination optical device having an improved imaging performance.

It is another object of the present invention to provide a high-power illumination optical device in which a plurality of secondary light sources each providing a laser beam are defined but in which uneven exposure due to the occurrence of interference fringes as described above is suppressed.

It is a further object of the present invention to provide a high-power illumination optical device assuring uniform and higher througput exposure with an improved imaging performance.

Briefly, according to the present invention, there is provided an illumination optical system including a plurality of separate laser sources or a plurality of separate secondary light sources defined by the laser beams emerging from the laser sources. On an area to be illuminated, the laser beams emerging from the laser sources or emerging from the secondary light sources are superposed upon one another, whereby uniform exposure and an improved imaging performance are assured.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
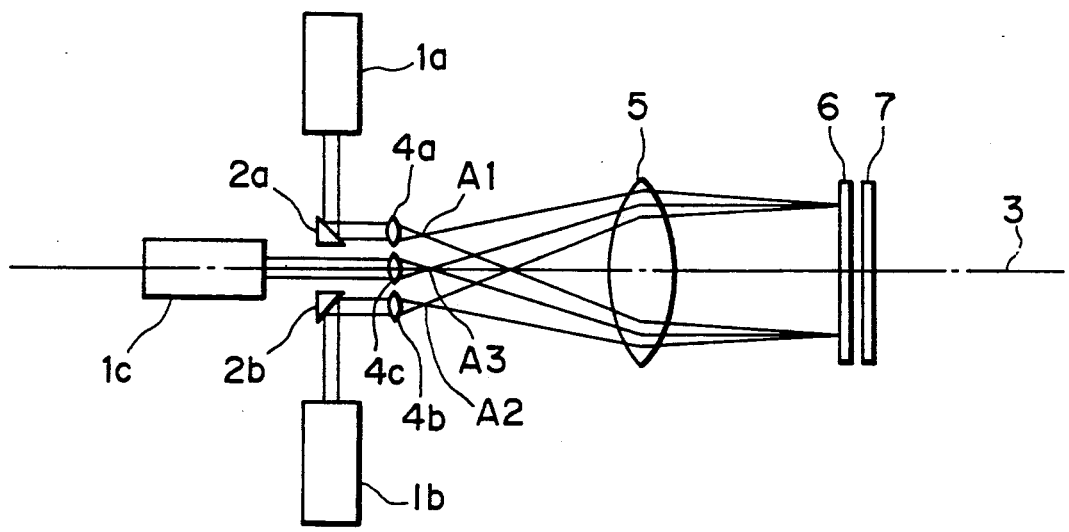
FIG. 1 is a schematic view showing an illumination optical system according to a first embodiment of the present invention.

Referring first to FIG. 1 showing an illumination optical device according to a first embodiment of the present invention, the device includes a plurality of light sources such as laser sources $1a$–$1c$. The laser sources $1a$ and $1b$ are disposed such that they emit laser beams travelling in the direction orthogonal to the optical axis 3 of the illumination optical device, while the laser source $1c$ is disposed such that it emits a laser beam travelling in the direction of the optical axis 3. Denoted by reference numerals $2a$ and $2b$ are mirrors for deflecting the laser beams emitted from the laser sources $1a$ and 1b, respectively, so that the laser beams are directed in the direction parallel to the optical axis 3. The device further includes convex lenses 4a–4c for forming a plurality of secondary light sources, three in the present embodiment. As is shown in FIG. 1, each of the convex lenses 4a–4c receives the laser beam emerging from an associated one of the laser sources 1a–1c and defines a secondary light source A1, A2 or A3. Thus, there are defined a plurality of secondary light sources A1–A3, the number corresponding to that of the laser sources 1a–1b.

Designated by reference numeral 5 is a converging lens having a focal plane coincident with or located close to the plane including the secondary light sources A1–A3. A mask 6 having a fine pattern for the manufacture of semiconductor circuit devices is disposed in or close to another focal plane of the lens 5, and a wafer 7 such as a silicon wafer is disposed behind the mask 6.

The laser beams emerging from the laser sources 1a and 1b are reflected by the mirrors 2a and 2b, respectively, toward the convex lenses 4a and 4b, respectively. On the other hand, the laser beam emitted from the laser source 1c is directly incident on the convex lens 4c. The laser beams emerging from the convex lenses 4a–4c define the secondary light sources A1–A3, respectively. Each of the divergent laser beams emerging from the secondary light sources A1–A3 uniformly illuminates the surface of the mask 6. At this time, the divergent laser beams emerging from the secondary light sources A1–A3, respectively, are superposed upon one another on the surface of the mask 6. Nevertheless, there would not occur interference fringes on the surface of the mask 6, since the secondary light sources A1–A3 are respectively defined by corresponding ones of the separate laser sources 1a–1c so that the coherence between the laser beams emerging from the secondary light sources A1–A3 is sufficiently low. As a result, uniformity of exposure on the surface of the wafer 7 is ensured.

While in the present embodiment convex lenses are used to define the secondary light sources, they may of course be replaced by concave lenses.

Figure 2:
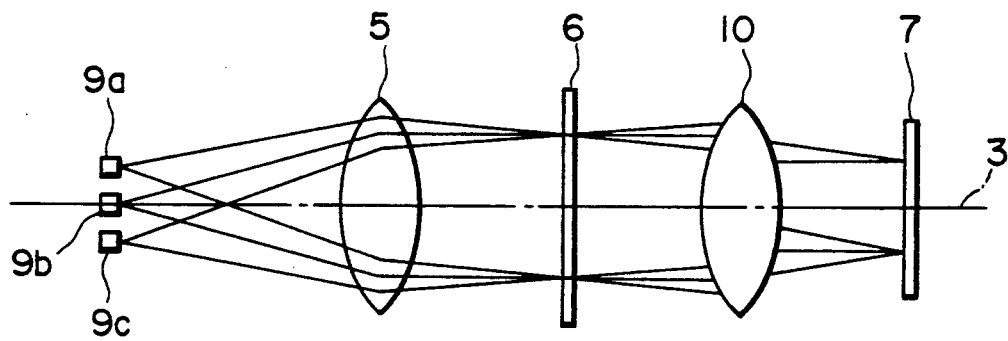
FIG. 2 is a schematic view showing an illumination optical system according to a second embodiment of the present invention.

An illumination optical system according to another embodiment of the present invention will now be described with reference to FIGS. 2 and 3. The illumination optical system according to this embodiment includes a plurality of semiconductor laser sources 9a–9c, three in the FIG. 2 embodiment. The light emitting portions of these semiconductor lasers 9a–9c are preferably disposed in a focal plane of a converging lens 5. A projection lens 10 is disposed between a mask 6 and a wafer 7. The significant distinction of the present embodiment over the FIG. 1 embodiment lies in that the semiconductor laser sources 9a–9c themselves constitute the secondary light sources, respectively.

As in the FIG. 1 embodiment, the laser beams emitted from the laser sources 9a–9c are converted or transformed by the lens 5 into light uniformly illuminating the mask 6 surface. Thus, the pattern of the mask 6 uniformly illuminated is transferred by the projection lens 10 onto the wafer 7 surface. Also in this case, there would not occur any interference fringes on the mask 6 surface, since the coherence between the laser beams emerging from the semiconductor lasers 9a–9c, respectively, is sufficiently low. As a result, uniform exposure of the wafer 7 is attainable.

Figure 3:
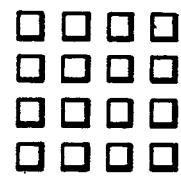
FIG. 3 is a front view schematically showing an example of an array of plural semiconductor lasers which can be employed in the FIG. 2 embodiment.

Particularly in the present embodiment, each semiconductor laser is very small in size, so that a number of such semiconductor lasers can be preferably and easily arrayed into a matrix form such as shown in FIG. 3.

Figure 4:
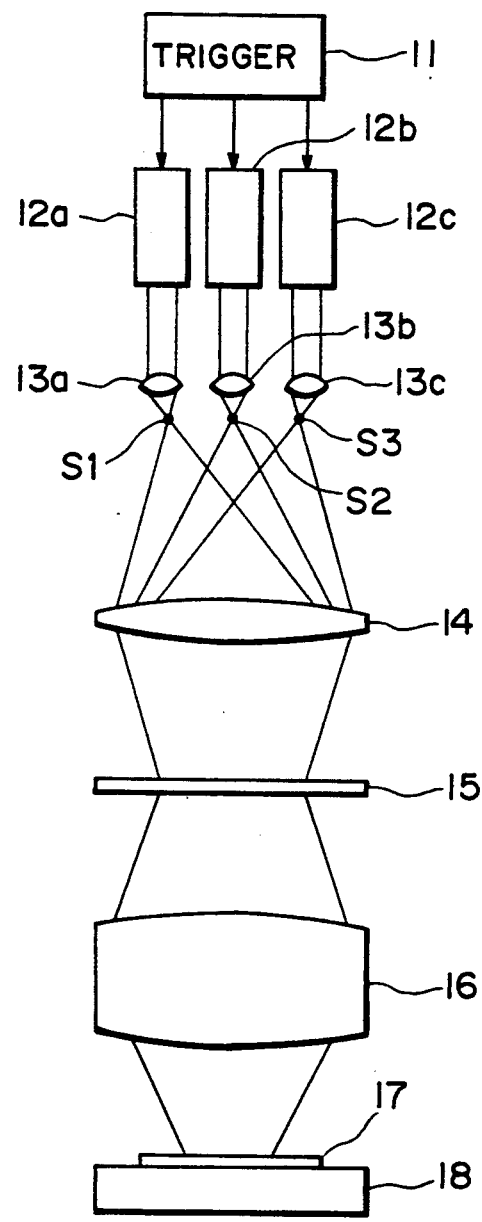
FIG. 4 is a schematic and diagrammatic view showing an illumination optical device according to a third embodiment of the present invention.

FIG. 4 shows an illumination optical system according to a third embodiment of the present invention, which is applied to an exposure apparatus to be used in the manufacture of semiconductor circuit devices. In this embodiment, a plurality of excimer lasers are employed as the light source means. The excimer laser is known as a pulse-oscillation type high luminance laser intermittently emitting laser beams at a repetition frequency of approx. 200–300 Hz. The emission time (duration of each pulse) is very short, such as within a range of approx. 10–30 nsec. Because of the high power of the excimer laser, one or a small number of pulses of the laser beams will usually provide a sufficient amount of exposure relative to an ordinary photoresist material. This assures reduction in the exposure time.

As is shown in FIG. 4, the exposure apparatus includes three excimer lasers 12a–12c, a trigger pulse generator 11 acting on the excimer lasers 12a–12c so that they emit pulses in synchronism with each other, convex lenses 13a–13c for respectively receiving the laser beams emitted from the excimer lasers 12a–12c and forming secondary light sources S1–S3, respectively. The apparatus further includes a lens system 14 for receiving the laser beams divergently emerging from the secondary light sources S1–S3 and for superposing the laser beams upon one another on the surface of a mask 15 having a minute pattern such as an integrated circuit pattern. The lens element 14 is disposed so that its focal plane is located in or close to the plane containing the secondary light sources S1–S3. A projection lens 16 is disposed between the mask 15 and a wafer 17 to project in a reduced magnification the pattern of a mask 15 onto the wafer 17. The wafer 17 is carried by a stage 18 which is arranged to be moved continuously to move continuously the wafer 17 in the imaging plane of the projection lens 16.

Figure 5:
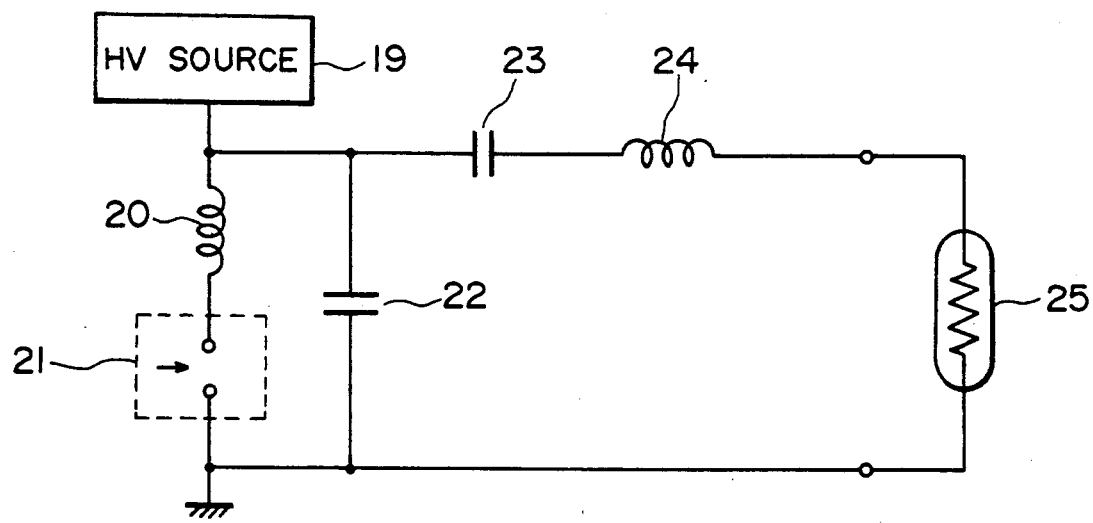
FIG. 5 is a diagram showing a laser drive circuit of the FIG. 4 embodiment.

FIG. 5 is a diagram showing a drive circuit for energizing the excimer lasers 12a–12c. The drive circuit includes a high voltage source 19, high voltage generating coils 20 and 24, discharging capacitors 22 and 23, a laser discharge tube 25, a discharge initiating trigger 21 formed by a trigger spark gap or thyratron. Each of the excimer lasers 12a–12c is provided with such a drive circuit as described above.

When in diagram of FIG. 5 a high voltage is supplied from the high voltage source 19, electric charges are accumulated in the capacitors 22 and 23. When, after charge accumulation, the trigger 21 is actuated, the laser discharge tube 25 is discharged. In this manner, each of the excimer lasers 12a–12c emits a pulse of laser beam.

The trigger pulse generator 11 generates trigger pulses and simultaneously supplies them to the triggers 21—21, respectively, of the drive circuits for the excimer lasers 12a–12c. By this, the excimer lasers 12a–12c emit pulses of laser beams in exact synchronism with each other. The pulses of the laser beams emerging from the excimer lasers 12a–12c are incident on the convex lenses 13a–13c, respectively and, after passing through the lenses 13a–13c, form secondary light sources S1–S3. The laser beams divergently emerging from the secondary light sources S1–S3 are superposed by the lens 14 upon one another on the surface of the mask 15, so that the mask 15 surface is illuminated uniformly.

Since each of the secondary light sources S1–S3 is defined by a corresponding one of the separate lasers 12a-12c, the coherence between the laser beams emerging respectively from the secondary light sources S1-S3 is sufficiently low. For this reason, superposition of the laser beams on the surface of the mask 15 would not cause any interference fringes, whereby uniform exposure of the wafer 17 is assured.

The stage 18 carrying thereon the wafer 17 is moved continuously by an unshown driving mechanism. When the stage 18 is moved to each of the predetermined positions, the trigger pulse generator 11 is actuated in response to a signal supplied thereto from an unshown position detector detecting the position of the stage 18, whereby pulses of laser beams are emitted exactly simultaneously from the excimer lasers 12a-12c, respectively.

As described in the foregoing, the emission time of each pulse (the duration of each pulse) is sufficiently short, such as within a range of approx. 10-30 nsec. Therefore, any image blur which may be caused on the wafer 17 surface by the continuous movement of the stage 18 is negligible. That is, if the moving speed of the stage 18 is, e.g., approx. 100 mm/sec., the maximum image blur which may appear on the wafer 17 surface is on the order of $100 \times 30 \times 10^{-9}$ mm=0.003 micron, which can apparently be neglected in view of the fact that the currently acknowledged tolerance for the image blur is on the order of 0.1 micron. The continuous movement of the stage 18 is effective to further improve the throughput of the apparatus, because it eliminates the necessity of a repetition of stop and re-start of movement of the stage.

Further, exactly synchronous pulse-emission of the excimer lasers 12a-12c is assured by means of the trigger pulse generator 11. This ensures exact registration in image formation on the wafer 17. That is, if, on the other hand, any time lag exists in the pulse beam emission of the excimer lasers 12a-12c, the laser beams emerging from the excimer lasers 12a-12c would not be incident on the same area on the wafer 17 surface because of the continuous movement of the stage 18.

It is however to be noted that a slight degradation in the synchronous relation between the excimer lasers 12a-12c (i.e., the presence of a very minute difference in the emission timing, duration of pulse, extinction timing, etc.) will be permitted unless it causes significant or unallowable image blur.

According to the present invention, the laser beams after being expanded by the lenses 13a-13c are superposed upon one another on the mask 15 surface. By this, higher illuminance is realized in proportion to the number of the laser sources, which results in a further improvement in the throughput of the apparatus. The number of the laser sources is not limited to three such as in the FIG. 4 embodiment, and two or more than three laser sources may be employed.

With respect to the spatial disposition of the secondary light sources, they may preferably be disposed linearly or triangularly in a case wherein three laser sources are employed, or disposed rectangularly in a case wherein four laser sources are employed. Such arrangement of the secondary light sources easily assures uniform illumination.

While in the FIG. 4 embodiment the invention has been described with reference to a projection type exposure apparatus, the exposure apparatus may of course be of proximity type. Further, the lens projection system 16 may of course be replaced by a mirror optical system.

Figure 6:
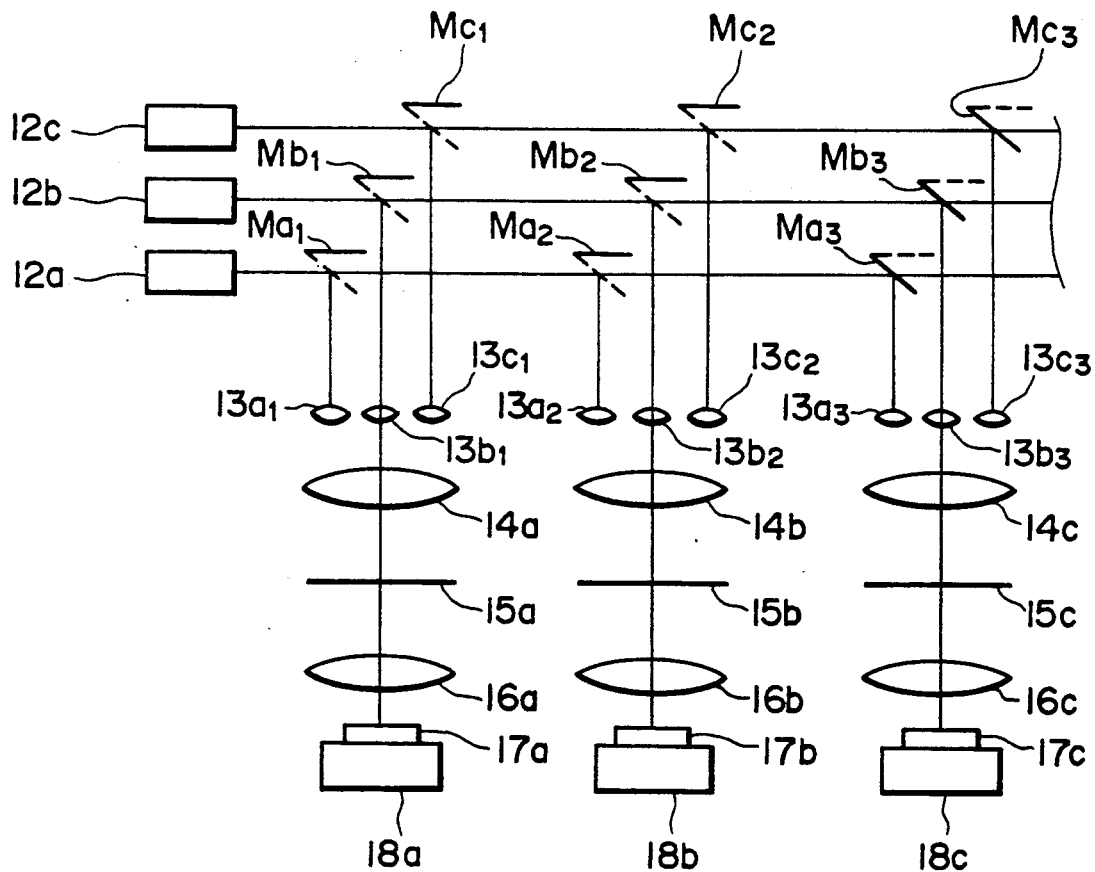
FIG. 6 is a schematic view showing an illumination optical system according to a fourth embodiment of the present invention, which is applied to an exposure apparatus having a plurality of exposure stations.

FIG. 6 shows an illumination optical system according to a fourth embodiment of the present invention, which is applied to an exposure apparatus as in the foregoing embodiments. The same reference numerals as in the foregoing embodiments are assigned to corresponding elements.

One of the distinctive features of the present embodiment over the foregoing embodiments lies in that the former includes a plurality of exposure stations. As is shown in FIG. 6, the exposure apparatus includes a plurality of light sources, three in the illustrated embodiment, each comprising a laser such as an excimer laser. The apparatus further includes plural sets of swingable mirrors $Ma_1$, $Mb_1$, $Mc_1$; $Ma_2$, $Mb_2$, $Mc_2$; $Ma_3$, $Mb_3$ and $Mc_3$ (only three sets being illustrated in the drawing), and also includes plural sets of convex lenses $13a_1$, $13b_1$, $13c_1$; $13a_2$, $13b_2$, $13c_2$; $13a_3$, $13b_3$, $13c_3$ (only three sets being illustrated in the drawing).

In operation, the laser beams emitted from the excimer lasers 12a-12c, respectively, are reflected by the mirrors $Ma_3$, $Mb_3$ and $Mc_3$, respectively, which mirrors are swingable in synchronism with each other. The laser beams reflected by the mirrors are directed to the convex lenses $13a_3$, $13b_3$ and $13c_3$, respectively, so that three secondary light sources are defined. The laser beams emerging from the secondary light sources are superposed by a lens system 14c upon one another on the surface of a mask 15c, so that the pattern of the mask 15c is transferred by a projection lens 16c onto a wafer 17c. The wafer 17c is carried by a stage 18c, so that it is moved by the movement of the stage 18c.

Similarly, the mirrors in each of the remaining sets ($Ma_1$, $Mb_1$, $Mc_1$; and $Ma_2$, $Mb_2$, $Mc_2$) are swingable in synchronism with each other. Upon exposure at the exposure station represented by the stage 18c, the swingable mirrors of the exposure stations other than the exposure station represented by the stage 18c are moved to the solid line positions shown in FIG. 6. Upon completion of exposure at the exposure station represented by the stage 18c, the mirrors of one of the other exposure stations are moved in synchronism with each other to the broken-line positions, so that the pattern of a corresponding mask (e.g. 15a) is transferred onto a corresponding wafer (e.g. 17a).

In this manner, the exposures relative to the wafers 17a, 17b, 17c . . . etc. are sequentially effected. The swingable movement of each of the mirrors is preferably synchronized with the pulse emission of a corresponding one of the excimer lasers.

With the arrangement of the FIG. 6 embodiment, the same light source means can be used for a plurality of exposure stations. As a result, the manufacturing cost for the exposure apparatus can be decreased while significantly increasing the throughput.

While in the FIG. 6 embodiment each mirror is provided by a high reflectance swingable mirror, it may be formed by a beam splitter which is fixedly secured. In such a case, simultaneous exposures relative to different exposure stations are attainable. Further, any types of lasers other than the excimer lasers may of course be used as the light sources 12a-12c.

In accordance with the present invention, as has hitherto been described, a plurality of separate laser sources are used whereby occurrence of any interference fringes on the area to be illuminated is prevented and uniform exposure of the area to be illuminated is achieved. Further, when the invention is applied to an exposure apparatus to be used in the manufacture of semiconductor circuit devices, higher illuminance and higher throughput are attainable.

While the invention has been described with reference to the structures disclosed herein, it is not confined to the details set forth and this application is intended to cover such modifications or changes as may come within the purposes of the improvements or the scope of the following claims.

What is claimed is:

1. An optical illumination system for illuminating an object, such as the original in an exposure apparatus for exposing a workpiece to a pattern of the original, said optical illumination system comprising:

illumination means comprising a plurality of illumination sources which are each coherent respectively, but which are incoherent with each other, said illumination means for defining different optical paths for light beams emitted from said illumination sources; and a lens system comprising a plurality of lens elements, each of said lens elements distributed along a respective optical path of a corresponding light beam in a plane perpendicular to an optical axis of said illumination means, each of said lens elements for irradiating the object with a corresponding one of the light beams from said illumination means.

2. An optical illumination system for illuminating an object, such as an original in an exposure apparatus for exposing a workpiece to a pattern of the original, said optical illumination system comprising:

light source means for supplying a plurality of light beams along different optical paths, each of the light beams being respectively coherent, but being incoherent with each other;

means for receiving light from said light source means and for forming a plurality of secondary light sources which are each respectively coherent, but which are incoherent with each other, said secondary light source forming means comprising a plurality of lens elements, each of said lens elements for receiving a corresponding one of the light beams from said light source means to produce the secondary light sources;

lens means for receiving light from said secondary light sources, for superimposing the light from said secondary light sources on the object, wherein said lens elements of said secondary light source forming means are distributed in a plane perpendicular to an optical axis of said lens means.

3. An optical illumination system according to claim 2, wherein said light source means comprises excimer laser beam producing means.

4. An exposure apparatus for exposing a workpiece to a pattern, said apparatus comprising:

a workpiece table for carrying thereon the workpiece and being continuously movable in a predetermined direction;

an illumination system for supplying, along different paths, a plurality of light beams which are coherent respectively, but are incoherent with each other, said illumination system supplying light beams in each of the paths and said illumination system comprising a plurality of lens elements arranged in a plane perpendicular to an optical axis of the illumination system for receiving the light beams without overlapping thereof and for producing a plurality of secondary light sources from the light beams received;

an optical arrangement for superimposing the light beams produced by the secondary sources upon the pattern so that the pattern is transferred onto the workpiece; and a controller for controlling supply of the light beams by said illumination system in accordance with the continuous movement of said workpiece table.

5. An exposure apparatus according to clam 4, further comprising an imaging optical system for forming, upon the workpiece, an image of the pattern irradiated with the light beams from said optical system.

6. An exposure apparatus according to claim 4, wherein said imaging optical system has a reduced magnification.

7. An exposure apparatus for exposing a workpiece to a pattern with radiation, said apparatus comprising:

a stage for holding the workpiece; and an illumination system comprising (i) light beam supplying means for supplying a plurality of light beams which are each coherent respectively, but which are incoherent with each other, (ii) a lens array, comprising a plurality of lens elements, for receiving the light beams to produce a plurality of secondary light sources which are each coherent respectively, but which are incoherent with each other, wherein the light beams supplied from said light beam supplying means are incident on said lens array free from overlapping, and (iii) a collecting optical system for receiving light beams from the secondary light sources and for projecting the received light beams to the pattern so that the projected light beams are incident on the pattern with overlapping.

8. An apparatus according to claim 7, wherein said light beam supplying means comprises means for supplying excimer laser beams as the light beams which are each coherent respectively, but which are incoherent with each other.

9. An exposure apparatus for exposing a workpiece to a pattern with radiation, said apparatus comprising:

a stage for holding the workpiece; and an illumination system comprising (i) light beam supplying means for supplying a plurality of light beams which are each coherent respectively, but which are incoherent with each other, (ii) a lens array for receiving the light beams from said light beam supplying means to produce a plurality of secondary light sources which are each coherent respectively, but which are incoherent with each other, wherein said lens array comprises a plurality of lens elements corresponding to the light beams supplied from said light beam supplying means and wherein each lens element receives only a corresponding one of the supplied light beams, and (iii) a collecting optical system for receiving light beams from the secondary light sources and for projecting the received light beams to the pattern so that the projected light beams are incident on the pattern with overlapping.

10. An apparatus according to claim 9, wherein said light beam supplying means comprises means for supplying excimer laser beams as the light beams which are each coherent respectively, but which are incoherent with each other.

11. A method of manufacturing semiconductor devices by using a lens array including a plurality of lens elements, said method comprising the steps of:

producing light beams which are each coherent respectively, but which are incoherent with each other;

projecting the light beams onto the lens array to produce a plurality of secondary light sources which are each coherent respectively, but which are incoherent with each other, wherein the projected light beams are incident on the lens array without overlapping;

projecting light beams from the secondary light sources to a pattern so that the projected light beams are incident on the pattern with overlapping; and exposing a workpiece to the pattern with light beams from the pattern.

12. A method according to claim 11, further comprising producing light beams by laser emission for projection to the lens array.

13. A method of manufacturing semiconductor devices by using a lens array including a plurality of lens elements, said method comprising the steps of:

producing light beams which are each coherent respectively, but which are incoherent with each other;

projecting the light beams onto the lens array to produce a plurality of secondary light sources which are each coherent respectively, but which are incoherent with each other, wherein the projected light beams are incident on the lens array so that each of the lens elements of the lens array receives only a corresponding one of the projected light beams;

projecting light beams from the secondary light sources to a pattern so that the projected light beams are incident on the pattern with overlapping; and exposing a workpiece to the pattern with light beams from the pattern.

14. A method according to claim 13, further comprising producing the light beams by laser emission for projection to the lens array.

* * * * *

UNITED STATES PATENT AND TRADEMARK OFFICE
CERTIFICATE OF CORRECTION

PATENT NO. : 5,091,744
DATED : February 25, 1992
INVENTOR(S) : Takashi Omata

It is certified that error appears in the above-identified patent and that said Letters Patent is hereby corrected as shown below:

On title page, item [30],

IN THE FOREIGN APPLICATION PRIORITY DATA

"Feb. 13, 1984 [JP] Japan ... 59-2289" should read --Feb. 13, 1984 [JP] Japan ... 59-22891-- and "Jan. 8, 1985 [JP] Japan ... 60-12941" should read --Jan. 8, 1985 [JP] Japan ... 60-1294--.

Title page, item [56],

IN THE FOREIGN PATENT DOCUMENTS

"1-23444 9/1975 Japan." should read --12344 9/1975 Japan.--;
"2-15621 12/1983 Japan." should read --215621 12/1983 Japan.--; and
"2-22522 12/1983 Japan." should read --222522 12/1983 Japan.--.

COLUMN 1

Line 23, "has" should read --have--.

UNITED STATES PATENT AND TRADEMARK OFFICE
CERTIFICATE OF CORRECTION

PATENT NO. : 5,091,744

DATED : February 25, 1992

INVENTOR(S) : Takashi Omata

It is certified that error appears in the above-identified patent and that said Letters Patent is hereby corrected as shown below:

COLUMN 2

Line 18, "througput" should read --throughput.--.

COLUMN 4

Line 47, "in" should read --in the--.

COLUMN 7

Line 43, "sources;" should read --sources; and--.

COLUMN 8

Line 8, "clam 4," should read --claim 4,--.

Signed and Sealed this

Third Day of August, 1993

MICHAEL K. KIRK

Attest:

Attesting Officer

Acting Commissioner of Patents and Trademarks